(12) United States Patent
Kim (10) Patent No.: US 9,966,148 B1
(45) Date of Patent: May 8, 2018

(54) DATA STORAGE DEVICE AND OPERATING METHOD THEREOF

(71) Applicant: SK hynix Inc., Gyeonggi-do (KR)

(72) Inventor: Min Kee Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/438,906

(22) Filed: Feb. 22, 2017

(30) Foreign Application Priority Data

Nov. 1, 2016 (KR) ........................ 10-2016-0144561

(51) Int. Cl.
| | | |
|---|---|---|
| G11C 11/34 | (2006.01) | |
| G11C 16/34 | (2006.01) | |
| G11C 16/10 | (2006.01) | |
| G11C 16/26 | (2006.01) | |

(52) U.S. Cl.
CPC .......... G11C 16/3459 (2013.01); G11C 16/10 (2013.01); G11C 16/26 (2013.01)

(58) Field of Classification Search
CPC ...... G11C 16/3459; G11C 16/10; G11C 16/26
USPC ........... 365/185.12, 185.03, 185.04, 185.05, 365/185.11, 185.17, 185.18, 185.19, 365/185.22, 185.23
See application file for complete search history.

(56) References Cited

U.S. PATENT DOCUMENTS

| | | | |
|---|---|---|---|
| 8,000,141 B1 | 8/2011 | Shalvi et al. | |
| 2014/0140134 A1* | 5/2014 | Tessariol ............ | G11C 16/0483 365/185.05 |
| 2014/0223246 A1* | 8/2014 | Kim ..................... | G11C 11/5642 714/718 |
| 2015/0103599 A1* | 4/2015 | Kim ........................ | G11C 16/26 365/185.12 |
| 2015/0117107 A1* | 4/2015 | Sun ........................ | G11C 16/10 365/185.12 |
| 2016/0247577 A1* | 8/2016 | Lee ........................ | G11C 16/34 |

* cited by examiner

*Primary Examiner* — Fernando Hidalgo
(74) *Attorney, Agent, or Firm* — IP & T Group LLP (57) ABSTRACT

A data storage device includes a nonvolatile memory device including word lines each including one or more pages; and a controller suitable for, in the case where recovery is made to a normal state from a power-off state, searching a word line including an erased page among the word lines, and selecting, when all pages of the word line including the erased page are erased pages, the corresponding word line as a reliability verification word line.

20 Claims, 11 Drawing Sheets

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0144561, filed on Nov. 1, 2016, in the Korean Intellectual Property Office, which is incorporated herein by reference in its entirety.

BACKGROUND

1. Technical Field

Various embodiments of the present invention relate generally to a data storage device including a nonvolatile memory device as a storage medium and an operating method thereof.

2. Related Art

Recently, the paradigm for the computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a data storage device which uses a memory device. A data storage device is used to store data to be used in a portable electronic device.

A data storage device using a memory device provides advantages in that, since there is no mechanical driving part, stability and durability are excellent, an information access speed is high and power consumption is small. Data storage devices having such advantages include a universal serial bus (USB) memory device, memory cards having various interfaces, a universal flash storage (UFS) device, and a solid state drive (SSD).

SUMMARY

Various embodiments are directed to a data storage device with improved reliability even when power supply to the data storage device is suddenly interrupted, and an operating method thereof.

In an embodiment, a data storage device may include: a nonvolatile memory device including word lines each corresponding to one or more pages; and a controller suitable for performing a reliability verification to a reliability verification word line among the word lines when the data storage device is recovered from a sudden power-off, wherein the reliability verification word line is a word line, all pages corresponding to which are erased pages.

In an embodiment, a method for operating a data storage device including a nonvolatile memory device which includes word lines each including one or more pages and a controller which controls the nonvolatile memory device may include: selecting a reliability verification word line among the word lines when the data storage device is recovered from a sudden power-off; performing a reliability verification to the reliability verification word line, wherein the reliability verification word line is a word line, all pages corresponding to which are erased pages.

In an embodiment, a data processing system comprising a host operatively coupled to a data storage device, the data storage device including: a nonvolatile memory device including a plurality of word lines each word line including one or more pages; and a controller suitable for, in the case where recovery is made to a normal state from a power-off state, searching a word line including an erased page among the word lines, and selecting, when all pages of the word line including the erased page are erased pages, the corresponding word line as a reliability verification word line.

According to the embodiments, the reliability of a data storage device may be improved.

BRIEF DESCRIPTION OF THE DRAWINGS

These and other features and advantages of the present invention will become apparent to those skilled in the art to which the present invention pertains by the following detailed description with reference to the following figures in which.

DETAILED DESCRIPTION

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a data storage device and an operating method thereof will be described below with reference to the accompanying drawings through various examples of embodiments.

Figure 1:
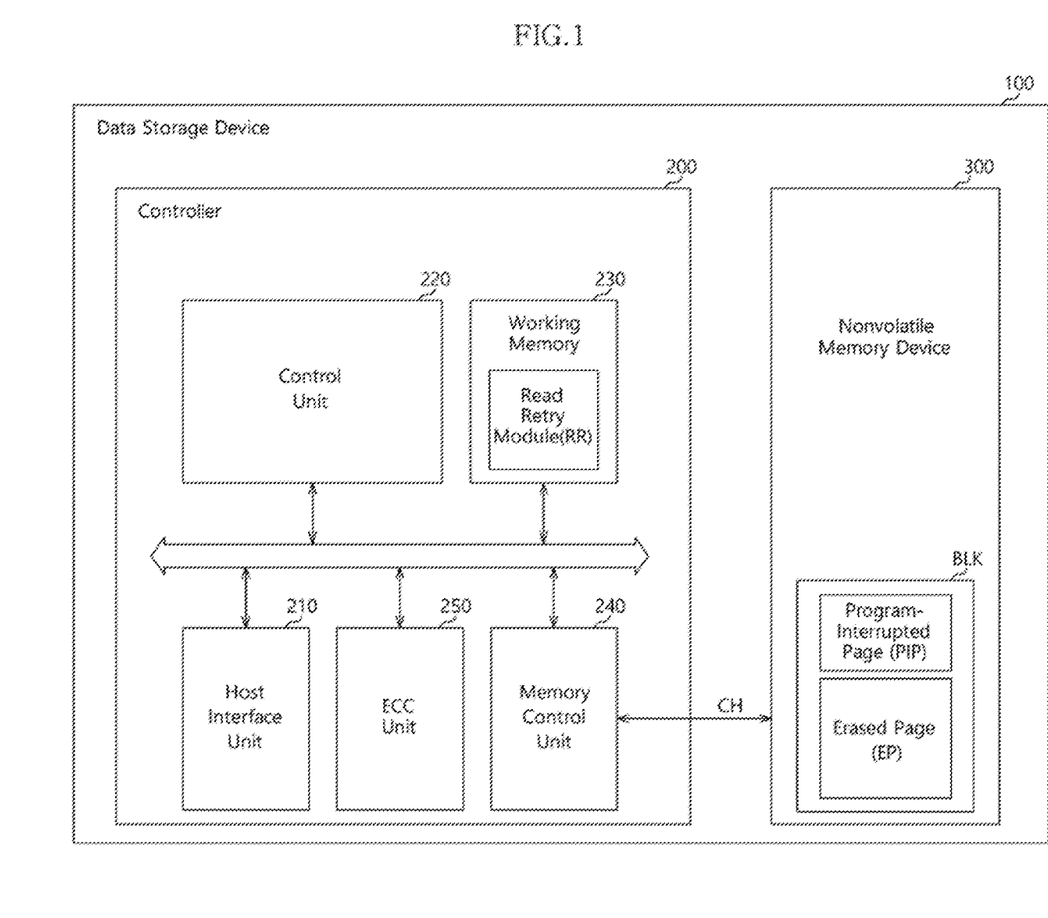
FIG. 1 is a block diagram illustrating a data storage device in accordance with an embodiment.

FIG. 1 is a block diagram illustrating a data storage device 100 in accordance with an embodiment. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be configured as any one of various kinds of storage devices according to the protocol of an interface which is electrically coupled with the host device. For example, the data storage device 100 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 100 may be manufactured as any one among various kinds of package types. For example, the data storage device 100 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The data storage device 100 may include a controller 200 and a nonvolatile memory device 300.

The controller 200 may include a host interface unit 210, a control unit 220, a working memory 230, a memory control unit 240, and an ECC (error correction code) unit 250.

The host interface unit 210 may interface the host device and the data storage device 100. For example, the host interface unit 210 may communicate with the host device by using a host interface, that is, any one among standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The control unit 220 may control general operations of the controller 200. The control unit 220 may drive an instruction or an algorithm of a code type, that is, a software, loaded on the working memory 230, and may control the operations of the internal function blocks of the controller 200. The control unit 220 may be constructed by a micro control unit (MCU) or a central processing unit (CPU).

The working memory 230 may store a software to be driven by the control unit 220. Also, the working memory 230 may store the data for driving the software. The software loaded on the working memory 230 will be described in detail with reference to FIG. 2. The working memory 230 may be implemented with a random access memory such as a dynamic random access memory (DRAM) or a static random access memory (SRAM).

The memory control unit 240 may control the nonvolatile memory device 300 according to control of the control unit 220. The memory control unit 240 may also be referred to as a memory interface unit. The memory control unit 240 may provide control signals to the nonvolatile memory device 300. The control signals may include a command, an address, a control signal and so forth for controlling the nonvolatile memory device 300. The memory control unit 240 may provide data to the nonvolatile memory device 300 or may be provided with the data read out from the nonvolatile memory device 300.

The error correction code (ECC) unit 250 may detect whether an error is included in the data read out from the nonvolatile memory device 300, and correct the error included in the data. To this end, the error correction code (ECC) unit 250 may generate an error correction code for data to be stored in the nonvolatile memory device 300. The error correction code (ECC) unit 250 may detect and correct an error of the data read out from the nonvolatile memory device 300, based on the error correction code.

The nonvolatile memory device 300 may be coupled with the controller 200 through a channel CH which means a signal line (or signal lines) capable of transmitting a command, an address, control signals and data. The nonvolatile memory device 300 may be used as the storage medium of the data storage device 100.

The nonvolatile memory device 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are a kind of nonvolatile random access memory devices capable of random access to memory cells. The nonvolatile memory device 300 may be configured by a combination of a NAND flash memory device and the above-described various types of nonvolatile random access memory devices. In the following descriptions, the nonvolatile memory device 300 which is configured by a flash memory device will be exemplified.

The memory region of the nonvolatile memory device 300 may be divided by the unit of block BLK. A block BLK may be a set of memory cells to be erased simultaneously.

Each block BLK may be divided by the unit of page P. A page P may be a set of memory cells to be read out simultaneously or be programmed simultaneously.

If power supplied to the data storage device 100 is suddenly interrupted or a sudden power-off occurs in the data storage device 100, the operation of the nonvolatile memory device 300 may not be completed normally and be interrupted.

For instance, in the case where a program operation is interrupted due to the sudden power-off of the nonvolatile memory device 300, if errors of the data stored in a program-interrupted page PIP are corrected by the ECC unit 250, the data stored in the program-interrupted page PIP may not be lost. If the errors of the data stored in the program-interrupted page PIP go out of the error correction capability of the ECC unit 250, the data stored in the program-interrupted page PIP may be lost.

For another instance, when the program operation is interrupted due to the sudden power-off of the data storage device 100, the program-interrupted page PIP may be identified even as an erased page EP storing no data since program pluses applied to the program-interrupted page PIP before the sudden power-off are not sufficient for data to be identified as programmed in the program-interrupted page PIP. In such a page, if a new program operation is performed, data reliability may be degraded.

According to an embodiment, when the data storage device 100 is recovered from the sudden power-off, the control unit 220 may perform a reliability verification to the erased page EP. The reliability verification may be performed through a read retry operation of a read retry module RR. Depending on a result of the reliability verification, data of the erased page EP may be reprogrammed in another page. In other words, in the case where the reliability of the erased page EP is determined as degraded as a result of the reliability verification, data of the erased page EP may be moved to and stored into another page.

Figure 2:
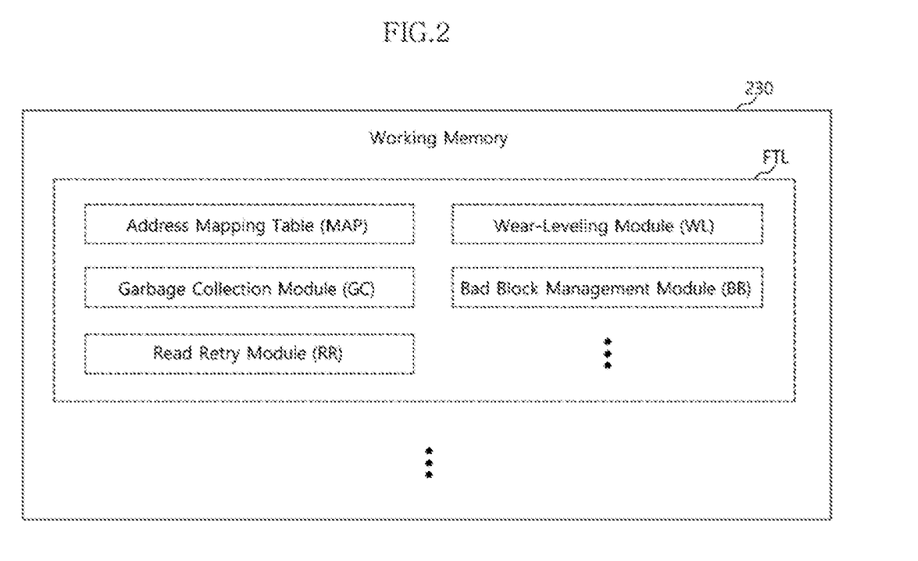
FIG. 2 is a block diagram illustrating a software loaded on a working memory of FIG. 1.

FIG. 2 is a block diagram illustrating the software loaded on the working memory 230. As described above, the nonvolatile memory device 300 may be erased by the unit of a block, and may be read or programmed by the unit of a page. Further, since it is not possible to overwrite the nonvolatile memory device 300, an erase operation should be performed to memory cells, which are storing data, before a program operation for new data to the memory cells.

The control unit 220 may drive the software called a flash translation layer FTL to control such characteristics of the nonvolatile memory device 300 and render device compatibility to the host device. Through driving of such a flash translation layer FTL, the data storage device 100 may be recognized as a general data storage device such as a hard disk, by the host device.

The flash translation layer FTL loaded on the working memory 230 may include modules for performing various functions and metadata required for driving of the modules. For example, the flash translation layer FTL may include an address mapping table MAP, a wear-leveling module WL, a garbage collection module GC, a bad block management module BB, and the read retry module RR.

In the case where the host device accesses the data storage device 100 (for example, requests a read operation or a write operation), the host device may provide a logical address to the data storage device 100. The flash translation layer FTL may translate the provided logical address into a physical address of the nonvolatile memory device 300, and perform a requested operation by referring to the converted physical address. In order for such an address translation operation, address translation data, that is, the address mapping table MAP may be included in the flash translation layer FTL.

The wear-leveling module WL may manage degrees of wear for the pages or memory blocks of the nonvolatile memory device 300. Memory cells of the nonvolatile memory device 300 may be aged by program and erase operations. Aged memory cells, that is, worn-out memory cells may cause fails. The wear-leveling module WL may manage the program-erase counts of respective memory blocks in such a way as to be leveled, in order to prevent a certain memory block from being worn out earlier than the other memory blocks.

The garbage collection module GC may manage memory blocks where fragmented data are stored. As described above, the nonvolatile memory device 300 is impossible to perform an overwrite operation, and unit of erase may be larger than unit of program. For this reason, the nonvolatile memory device 300 may need an operation of collecting valid data dispersed at physically different positions to one place, when a storage space reaches a limit. The garbage collection module GC may perform an operation of collecting valid data fragmented due to performing of a plurality of write operations and a plurality of erase operations, to a collection area, thereby securing a usable memory area.

The bad block management module BB may manage a block in which a fall has occurred, among the blocks of the nonvolatile memory device 300. As described above, a fail may occur in a worn-out memory cell. Data stored in a failed memory cell may not be read out normally. Moreover, data may not be stored normally in a failed memory cell. The bad block management module BB may manage a block including a failed memory cell, in such a way as not to be used.

For various reasons, an error may be included in the data stored in the nonvolatile memory device 300. An error included in data may be detected and corrected by the ECC unit 250. However, in the case where an error included in data may not be corrected by the ECC unit 250, a read fail may occur. The read retry module RR may control the nonvolatile memory device 300 such that a read retry operation is performed to a memory cell in which a read fail has occurred. For example, the read retry module RR may provide a read retry voltage to the nonvolatile memory device 300, and may control the nonvolatile memory device 300 to perform again a read operation.

Figure 3:
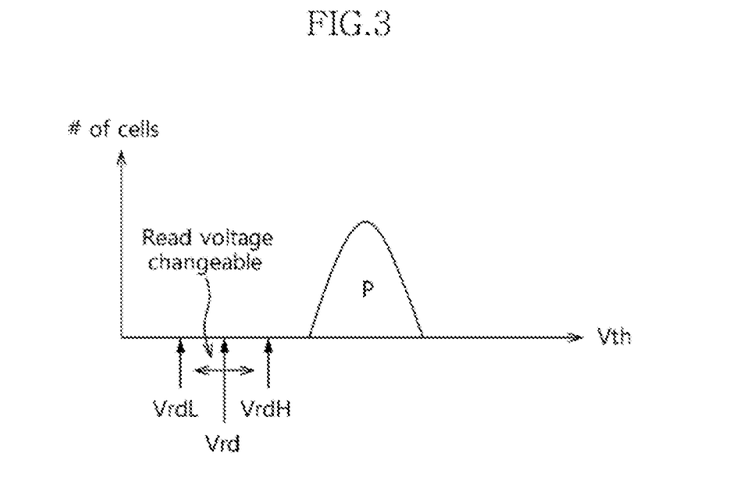
FIG. 3 is a threshold voltage diagram illustrating an operation of a read retry module of FIG. 2.

FIG. 3 is a threshold voltage diagram illustrating an operation of the read retry module RR. As shown in FIG. 3, during the read retry operation, data stored in a memory cell may be read out according to changed read voltage or a read retry voltage thereby determining a program state P of the memory cell. During the read retry operation, the read retry voltage such as a read voltage VrdL lower than an original read voltage Vrd or a read voltage VrdH higher than the original voltage Vrd may be applied to the word line of the memory cell. The read retry operation may be performed a predetermined number of times until a read fall does not occur.

Figure 4:
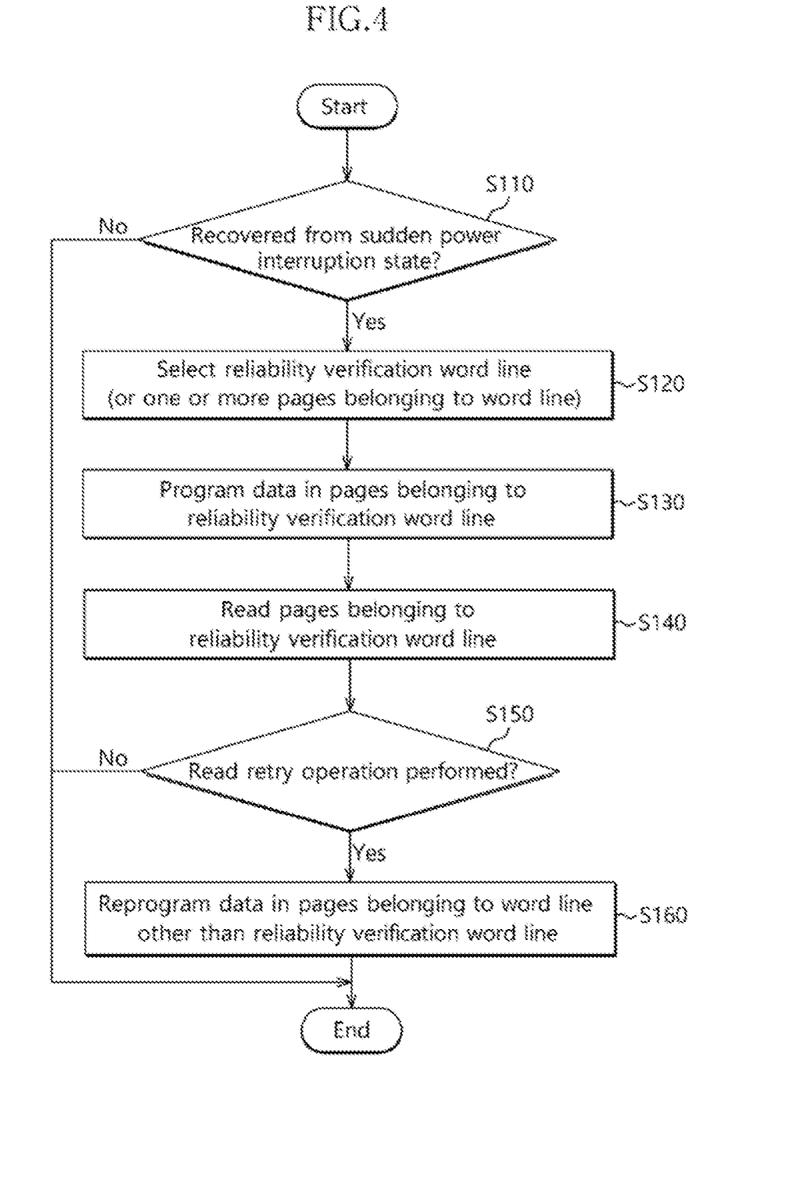
FIG. 4 is a flow chart illustrating an operation of a data storage device in accordance with an embodiment.
Figure 5:
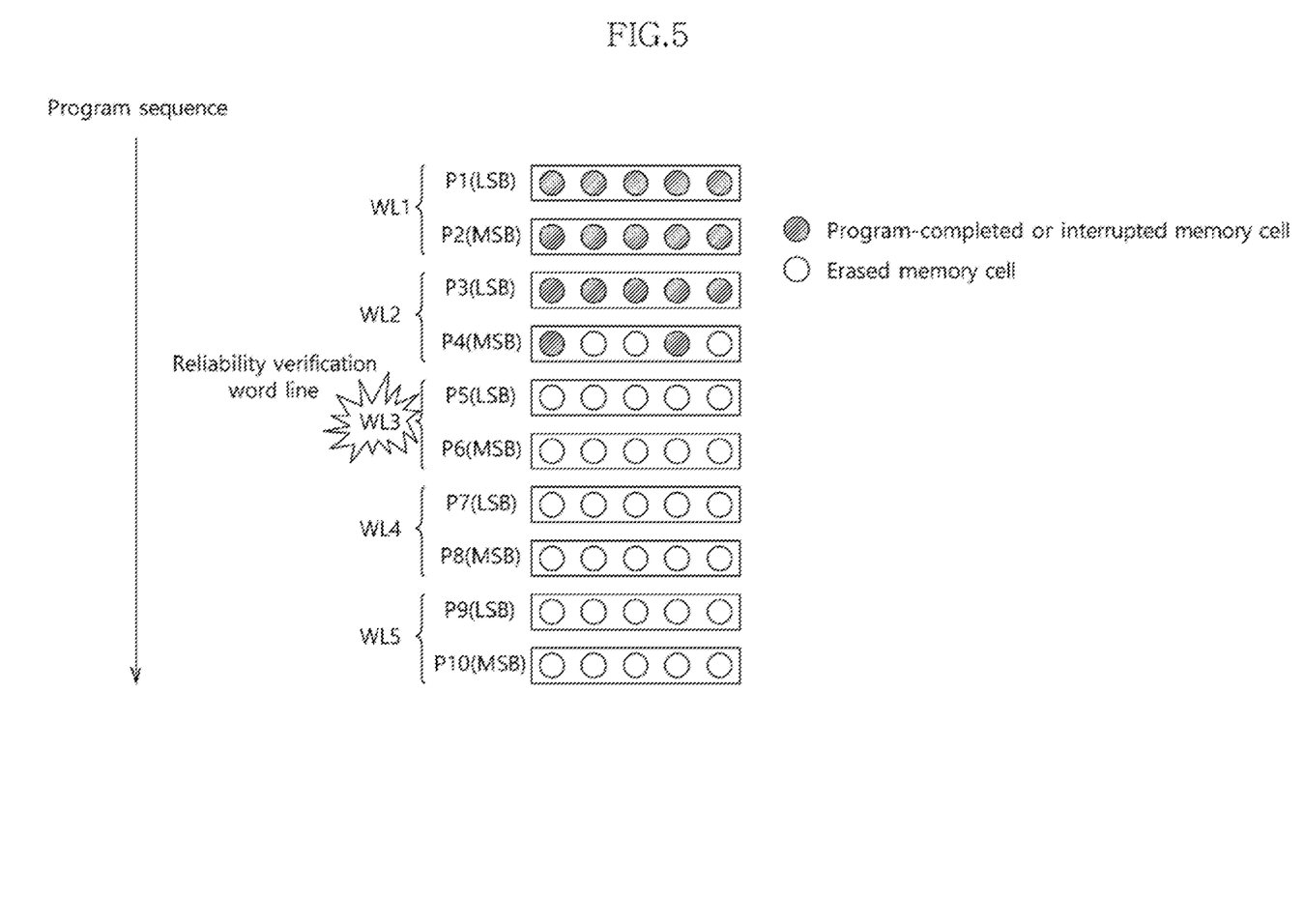
FIGS. 5 and 6 are schematic diagrams illustrating a reliability verification word line in accordance with an embodiment.
Figure 6:
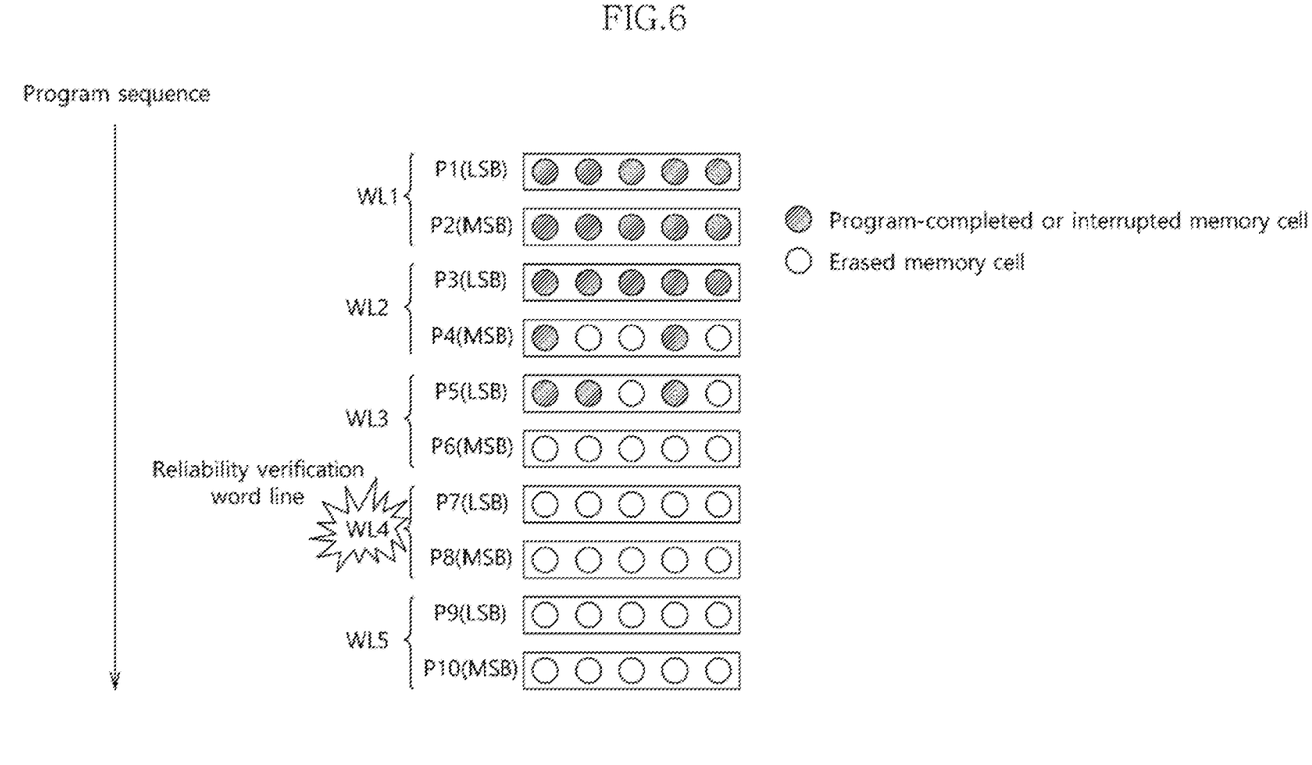

FIG. 4 is a flow chart illustrating an operation of the data storage device 100 in accordance with the embodiment. FIGS. 5 and 6 are schematic diagrams illustrating a reliability verification word line in accordance with the embodiment. FIGS. 5 and 6 exemplify the nonvolatile memory device 300 including five word lines WL1 to WL5 each corresponding to a lower page (or an LSB page) and an upper page (or an MSB page), and pages P1 to P10 of the word lines WL1 to WL5 programmed in ascending sequence from the first page P1 to the tenth page P10. The configuration and program sequence of pages may be changed variously according to whether memory cells are single level cells or multi-level cells which store data of two or more bits. Hereinbelow, the operation of the controller 200, that is, the control unit 220, which performs the reliability verification to the nonvolatile memory device 300, will be described with reference to FIGS. 4 to 6.

At step S110, it may be determined whether the data storage device 100 is recovered to a normal state from the sudden power-off. When it is not the case that recovery is made from a sudden power interruption state, the reliability verification process may be ended. When it is the case that recovery is made from a sudden power interruption state, the process may proceed to step S120.

At the step S120, a reliability verification word line may be selected as a target of the reliability verification. The reliability verification word line may be a word line, all pages corresponding to which are the erased pages EP.

For example, referring to FIG. 5, the pages P1 to P10 may be read according to the ascending program sequence as exemplified, and the erased fifth page P5 which is earliest in the program sequence among erased pages P5 to P10 may be searched. Since all the pages (i.e., the fifth and sixth pages P5 and P6) corresponding to the third word line WL3 to are erased pages, the third word line WL3 may be selected as the reliability verification word line.

For another example, referring to FIG. 6, the pages P1 to P10 may be read according to the program sequence, and the erased sixth page P6 which is earliest in the program sequence among erased pages P6 to P10 may be searched. Since the fifth page P5 is not the erased page and thus not all the pages corresponding to the third word line WL3 are erased pages, the third word line WL3 may not be selected as the reliability verification word line. In succession, the erased seventh page P7 which is earliest next to the erased sixth page P6 in the program sequence may be searched. Since the eighth page P8 as well as the seventh page P7 is the erased page and thus all the pages corresponding to the fourth word line WL4 are erased pages, the fourth word line WL4 may be selected as the reliability verification word line.

At step S130, data may be programmed into all of the erased pages corresponding to the reliability verification word line. Data to be programmed may be not a test data but a user data which is write-requested to the data storage device 100 by the host device. For example, user data may be programmed into the fifth and sixth pages P5 and P6 corresponding to the third word line WL3 (i.e., the reliability verification word line) of FIG. 5. For another example, user data may be programmed into the seventh and eighth pages P7 and P8 corresponding to the fourth word line WL4 (i.e., the reliability verification word line) of FIG. 6.

At step S140, the programmed pages corresponding to the reliability verification word line may be read.

When an error is detected in the data read from the programmed pages corresponding to the reliability verification word line but cannot be corrected during the read operation of step S140, the read retry operation may be performed to the programmed pages corresponding to the reliability verification word line. At step S150, it may be determined by the control unit 220 whether the read retry module RR performs the read retry operation to the programmed pages corresponding to the reliability verification word line due to the uncorrectable error in the data read from the programmed pages corresponding to the reliability verification word line during the read operation of step S140. The uncorrectable error in the data programmed into the erased pages corresponding to the reliability verification word line may indicate that one or more of the erased pages corresponding to the reliability verification word line are substantially the program-interrupted pages PIP, program pluses applied to which before the sudden power-off are not sufficient for data to be identified as programmed. In this case, error handling step may be performed at step S160.

At the step S160, data may be re-programmed into pages corresponding to a word line other than the reliability verification word line. Data may be re-programmed in pages corresponding to a word line to be programmed next to the reliability verification word line according to the program sequence. Data to be programmed at step S160 may be the same as the user data programmed to the erased pages corresponding to the reliability verification word line at step S130. In other words, the error handling step may be performed at step S160 in such a way as to re-program the user data, which is programmed in the page of low reliability (i.e., the erased pages corresponding to the reliability verification word line), into a normal pages.

When no error is detected or any error is corrected in the data read from the programmed pages corresponding to the reliability verification word line during the read operation of step S140, the programmed pages corresponding to the reliability verification word line may be identified as normal and thus the read retry operation may not be performed. Therefore, the reliability verification process may be ended.

Figure 7:
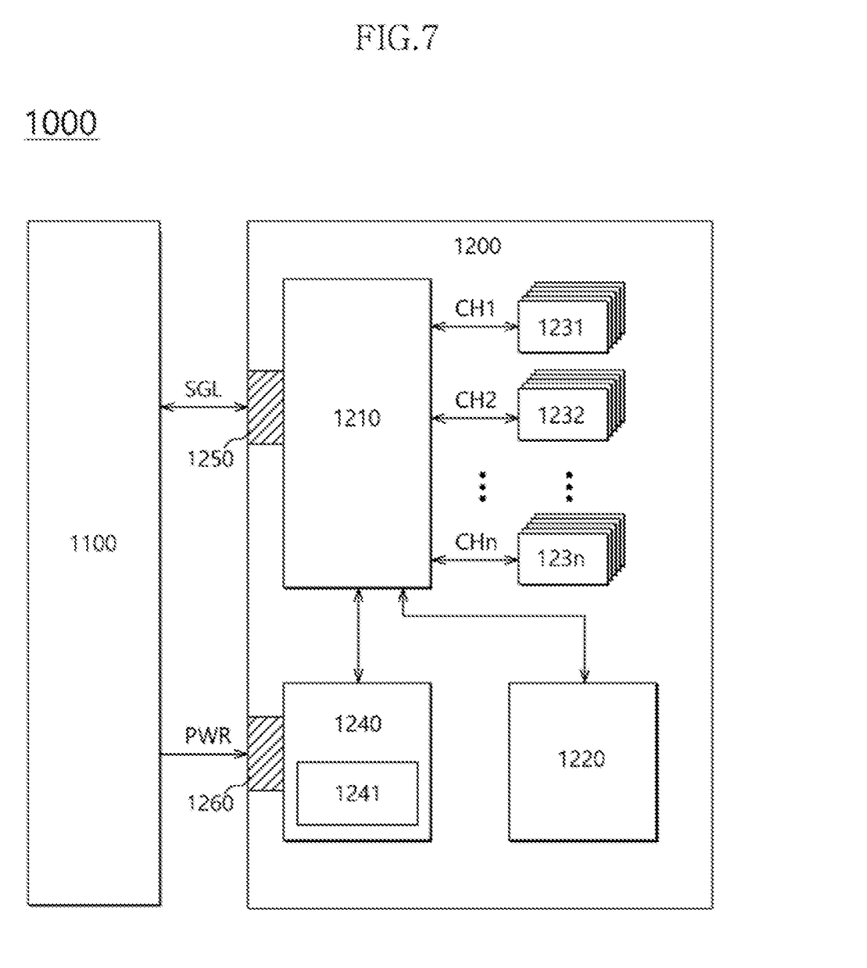
FIG. 7 is a diagram illustrating a representation of an example of a data processing system including a solid state drive (SSD) in accordance with an embodiment.

FIG. 7 is a diagram illustrating a representation of an example of a data processing system including a solid state drive (SSD) in accordance with an embodiment. Referring to FIG. 7, a data processing system 1000 may include a host device 1100 and a solid state drive (SSD) 1200.

The SSD 1200 may include a controller 1210, a buffer memory device 1220, nonvolatile memory devices 1231 to 123n, a power supply 1240, a signal connector 1250, and a power connector 1260.

The controller 1210 may control general operations of the SSD 1200.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacitance capacitors capable of charging power PWR.

The controller 1210 may exchange a signal SGL with the host device 1100 through the signal connector 1250. The signal SGL may include a command, an address, data, and so forth. The signal connector 1250 may be constructed by various types of connectors depending on an interface scheme between the host device 1100 and the SSD 1200.

Figure 8:
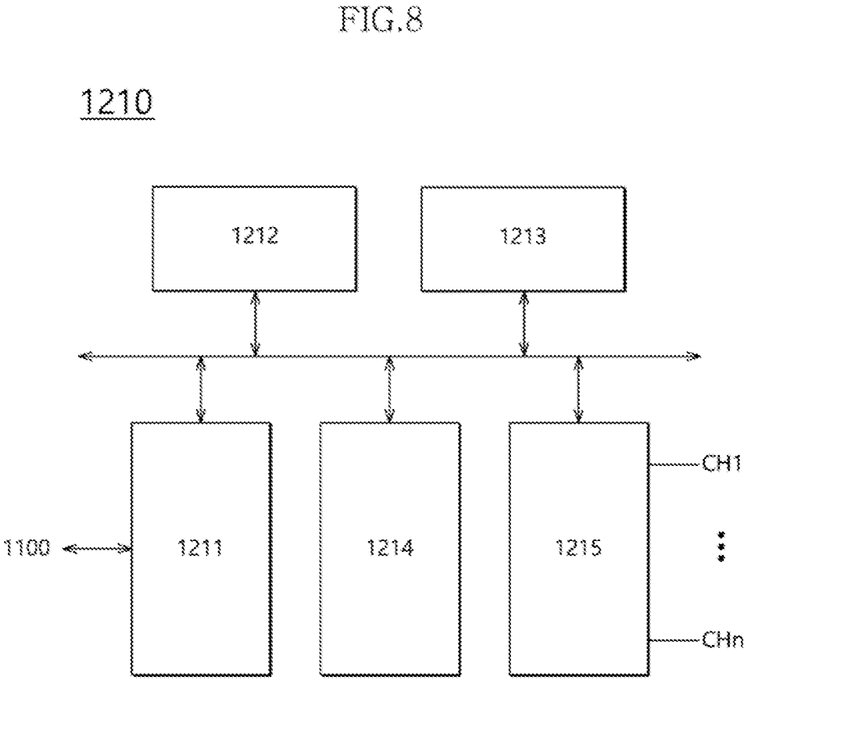
FIG. 8 is a diagram illustrating a representation of an example of the controller shown in FIG. 7.

FIG. 8 is a diagram illustrating a representation of an example of the controller shown in FIG. 7. Referring to FIG. 8, the controller 1210 may include a host interface unit 1211, a control unit 1212, a random access memory 1213, an error correction code (ECC) unit 1214, and a memory interface unit 1215.

The host interface unit 1211 may interface the host device 1100 and the SSD 1200 according to the protocol of the host device 1100. For example, the host interface unit 1211 may communicate with the host device 1100 through any one of secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS) protocols. In addition, the host interface unit 1211 may perform a disk emulating function for supporting the host device 1100 to recognize the SSD 1200 as a general purpose data storage device, for example, a hard disk drive (HDD).

The control unit 1212 may analyze and process the signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate the parity data of data to be transmitted to the nonvolatile memory devices 1231 to 123*n*. The generated parity data may be stored together with the data in the nonvolatile memory devices 1231 to 123*n*. The error correction code (ECC) unit 1214 may detect an error of the data read out from the nonvolatile memory devices 1231 to 123*n*, based on parity data. If a detected error is within a correctable range, the error correction code (ECC) unit 1214 may correct the detected error.

The memory interface unit 1215 may provide control signals such as commands and addresses to the nonvolatile memory devices 1231 to 123*n*, according to control of the control unit 1212. Moreover, the memory interface unit 1215 may exchange data with the nonvolatile memory devices 1231 to 123*n*, according to control of the control unit 1212. For example, the memory interface unit 1215 may provide the data stored in the buffer memory device 1220, to the nonvolatile memory devices 1231 to 123*n*, or provide the data read out from the nonvolatile memory devices 1231 to 123*n*, to the buffer memory device 1220.

Figure 9:
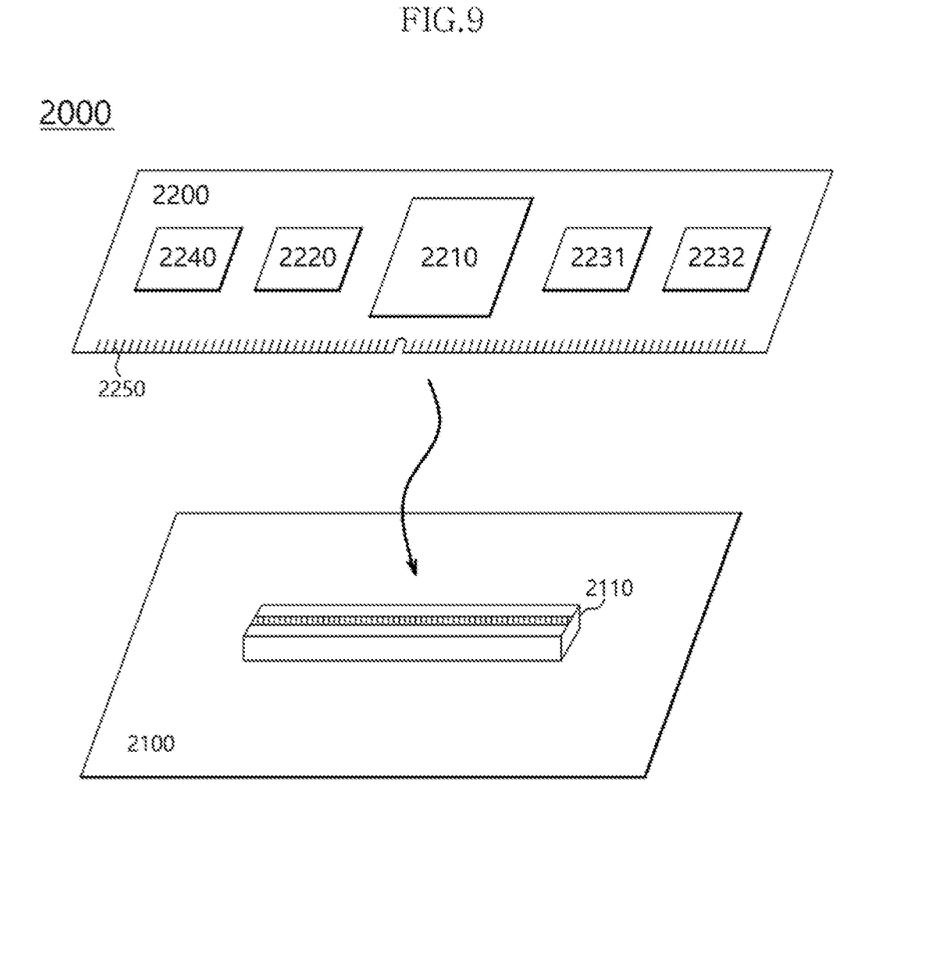
FIG. 9 is a diagram illustrating a representation of an example of a data processing system including a data storage device in accordance with an embodiment.

FIG. 9 is a diagram illustrating a representation of an example of a data processing system including a data storage device in accordance with an embodiment. Referring to FIG. 9, a data processing system 2000 may include a host device 2100 and a data storage device 2200.

The host device 2100 may be constructed in the form of a board such as a printed circuit board. Although not shown, the host device 3100 may include internal function blocks for performing the function of a host device.

The host device 2100 may include a connection terminal 2110 such as a socket, a slot or a connector. The data storage device 2200 may be mounted to the connection terminal 2110.

The data storage device 2200 may be constructed in the form of a board such as a printed circuit board. The data storage device 2200 may be referred to as a memory module or a memory card. The data storage device 2200 may include a controller 2210, a buffer memory device 2220, nonvolatile memory devices 2231 and 2232, a power management integrated circuit (PMIC) 2240, and a connection terminal 2250.

The controller 2210 may control general operations of the data storage device 2200. The controller 2210 may be configured in the same manner as the controller 1210 shown in FIG. 7.

The buffer memory device 2220 may temporarily store data to be stored in the nonvolatile memory devices 2231 and 2232. Further, the buffer memory device 2220 may temporarily store the data read out from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the data storage device 2200.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be constructed into various types depending on an interface scheme between the host device 2100 and the data storage device 2200. The connection terminal 2250 may be disposed on any one side of the data storage device 2200.

Figure 10:
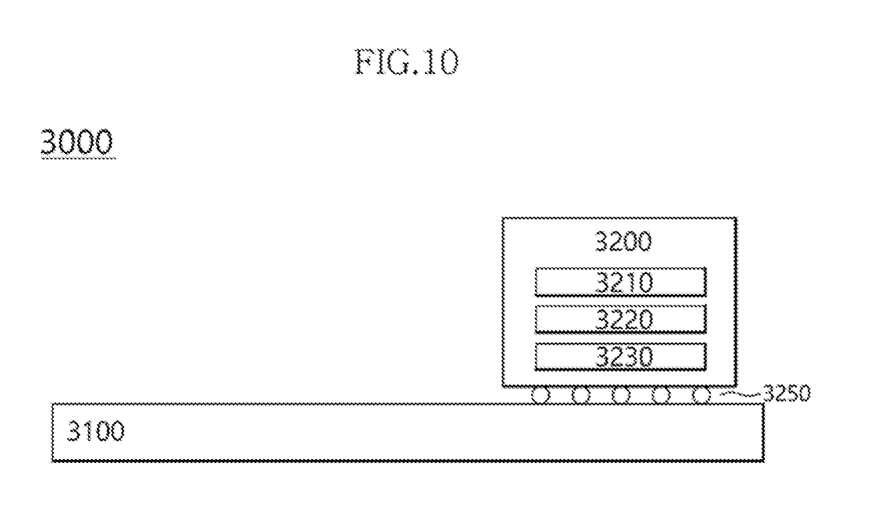
FIG. 10 is a diagram illustrating a representation of an example of a data processing system including a data storage device in accordance with an embodiment.

FIG. 10 is a diagram illustrating a representation of an example of a data processing system including a data storage device in accordance with an embodiment. Referring to FIG. 10, a data processing system 3000 may include a host device 3100 and a data storage device 3200.

The host device 3100 may be constructed in the form of a board such as a printed circuit board. Although not shown, the host device 3100 may include internal function blocks for performing the function of a host device.

The data storage device 3200 may be constructed in the form of a surface-mounting type package. The data storage device 3200 may be mounted to the host device 3100 through solder balls 3250. The data storage device 3200 may include a controller 3210, a buffer memory device 3220, and a nonvolatile memory device 3230.

The controller 3210 may control general operations of the data storage device 3200. The controller 3210 may be configured in the same manner as the controller 1210 shown in FIG. 7.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 11:
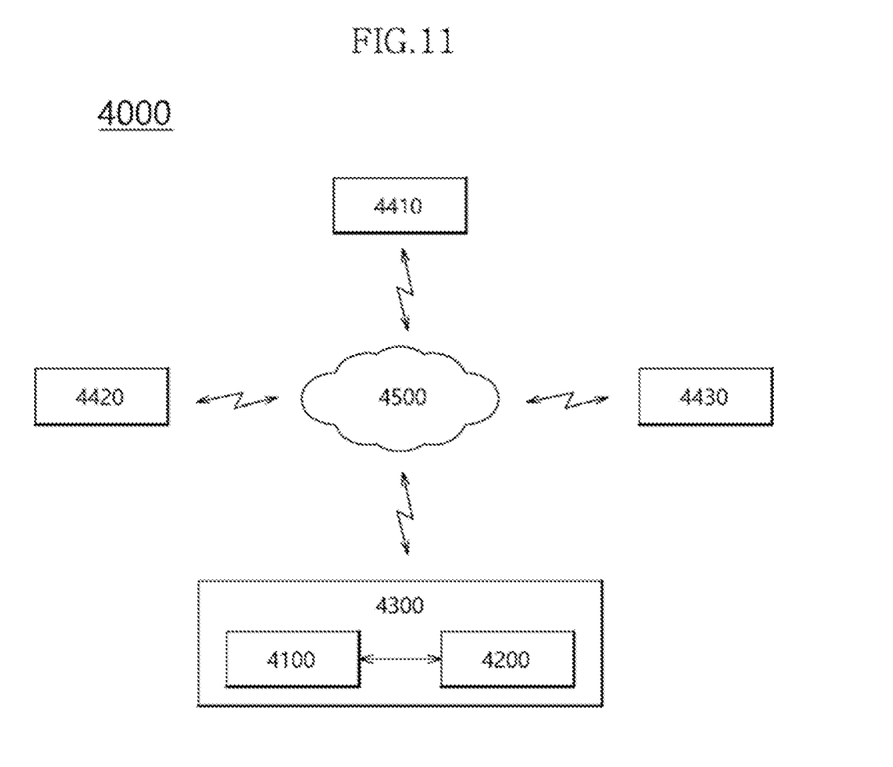
FIG. 11 is a diagram illustrating a representation of an example of a network system including a data storage device in accordance with an embodiment.

FIG. 11 is a diagram illustrating a representation of an example of a network system including a data storage device in accordance with an embodiment. Referring to FIG. 11, a network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 100 shown in FIG. 1, the data storage device 1200 shown in FIG. 7, the data storage device 2200 shown in FIG. 9 or the data storage device 3200 shown in FIG. 10.

Figure 12:
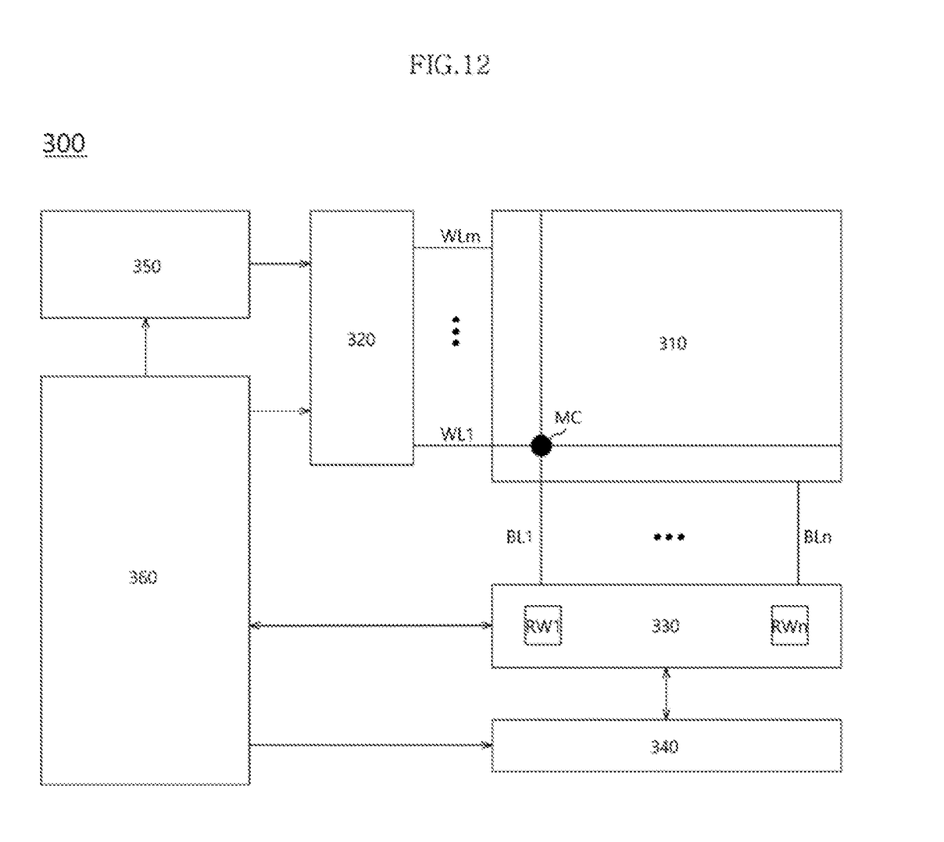
FIG. 12 is a block diagram illustrating a representation of an example of a nonvolatile memory device included in a data storage device in accordance with an embodiment.

FIG. 12 is a block diagram illustrating a representation of an example of a nonvolatile memory device included in a data storage device in accordance with an embodiment. Referring to FIG. 12, the nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be used in internal operations of the semiconductor memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the semiconductor memory device 300, based on control signals provided from the external device. For example, the control logic 360 may control operations of the semiconductor memory device 300 such as read, write and erase operations of the semiconductor memory device 300.

While various embodiments have been described above, it will be understood to those skilled in the art that the embodiments described are examples only. Accordingly, the data storage device and the operating method thereof described herein should not be limited based on the described embodiments. Many other embodiments and variations thereof may be envisaged by those skilled in this art without departing from the scope of the present invention as defined by the following claims.

What is claimed is:

1. A data storage device comprising:
a nonvolatile memory device including word lines each corresponding to one or more pages; and
a controller suitable for performing a reliability verification to a reliability verification word line among the word lines when the data storage device is recovered from a sudden power-off,
wherein the reliability verification word line is a word line, all pages corresponding to which are identified as erased pages, and
wherein the reliability verification is performed to determine whether one or more of the identified erased pages corresponding to the reliability verification word line are actually in an erase state or in a program-interrupted state.

2. The data storage device according to claim 1, wherein the controller performs the reliability verification by programming data in all of the erased pages of the reliability verification word line and determining reliability of the reliability verification word line based on whether or not a read retry operation is performed to the pages of the reliability verification word line while reading the data programmed in the erased pages of the reliability verification word line.

3. The data storage device according to claim 2, wherein the controller further re-programs the data in pages of a word line other than the reliability verification word line when the read retry operation is performed to the pages of the reliability verification word line.

4. The data storage device according to claim 3, wherein the controller further re-programs the data in pages of a word line next to the reliability verification word line.

5. The data storage device according to claim 2, wherein the read retry operation is performed by changing a read voltage.

6. The data storage device according to claim 1, wherein the controller further selects the reliability verification word line by searching the word lines according to a program sequence of the word lines.

7. A method for operating a data storage device including a nonvolatile memory device which includes word lines each corresponding to one or more pages, the method comprising:
selecting a reliability verification word line among the word lines when the data storage device is recovered from a sudden power-off; and
performing a reliability verification to the reliability verification word line, wherein the reliability verification word line is a word line, all pages corresponding to which are identified as erased pages, and wherein the performing of the reliability verification is determining whether one or more of the identified erased pages corresponding to the reliability verification word line are actually in an erase state or in a program-interrupted state.

8. The method according to claim 7, wherein the performing of the reliability verification word line includes:

programming data in all of the erased pages of the reliability verification word line; and reading the data programmed in the pages of the reliability verification word line.

9. The method according to claim 8, wherein the performing of the reliability verification further includes determining reliability of the reliability verification word line based on whether or not a read retry operation is performed to the pages of the reliability verification word line while reading the data programmed in the pages of the reliability verification word line.

10. The method according to claim 9, wherein further comprising re-programming the data in pages of a word line other than the reliability verification word line when the read retry operation is performed to the pages of the reliability verification word line.

11. The method according to claim 10, wherein the re-programming of the data is performed to a word line next to the reliability verification word line.

12. The method according to claim 9, wherein the read retry operation is performed according to a read retry voltage.

13. The method according to claim 12, wherein the read retry voltage is lower or higher than an original read voltage.

14. A data processing system comprising a host operatively coupled to a data storage device, the data storage device comprising:

a nonvolatile memory device including a plurality of word lines each word line including one or more pages; and a controller suitable for, in the case where recovery is made to a normal state from a power-off state, searching a word line including an erased page among the word lines, and selecting, when all pages of the word line including the erased page are identified as erased pages, the corresponding word line as a reliability verification word line, wherein the controller performs a reliability verification to the reliability verification word line to determine whether one or more of the identified erased pages corresponding to the reliability verification word line are actually in an erase state or in a program-interrupted state.

15. The data processing system according to claim 14, wherein the controller performs the reliability verification by programming data in all pages of the reliability verification word line, and determining reliability of the reliability verification word line based on whether or not a read retry operation is performed, when reading the data programmed in all the pages of the reliability verification word line.

16. The data processing system according to claim 15, wherein, in the case where the read retry operation is performed, the controller reprograms the data in pages of another word line other than the reliability verification word line.

17. The data processing system according to claim 16, wherein another word line is a word line which is to be programmed next to the reliability verification word line.

18. The data processing system according to claim 14, further comprising a network operatively coupled to the data processing system.

19. The data processing system according to claim 14, wherein the data storage device is a solid state drive.

20. The data processing system according to claim 14 wherein the data storage device is mounted to the host device through a plurality of solder balls.

* * * * *